United States Patent
Moore et al.

(10) Patent No.: US 6,502,426 B2
(45) Date of Patent: Jan. 7, 2003

(54) OXYGEN DOPING OF SILICON OXYFLUORIDE GLASS

(75) Inventors: Lisa A. Moore; Charlene M. Smith, both of Corning, NY (US)

(73) Assignee: Corning Incorporated, Corning, NY (US)

(*) Notice: Subject to any disclaimer, the term of this patent is extended or adjusted under 35 U.S.C. 154(b) by 75 days.

(21) Appl. No.: 09/997,782

(22) Filed: Nov. 28, 2001

(65) Prior Publication Data

US 2002/0134111 A1 Sep. 26, 2002

Related U.S. Application Data (60) Provisional application No. 60/271,135, filed on Feb. 24, 2001, and provisional application No. 60/271,136, filed on Feb. 24, 2001.

(51) Int. Cl.[7] .......................... C03B 32/00; C03C 23/00
(52) U.S. Cl. ....................... 65/111; 65/397; 65/399; 428/428; 430/5; 501/54
(58) Field of Search ................ 430/5; 501/54; 428/428; 65/30.1, 111, 391, 397, 399

(56) References Cited

U.S. PATENT DOCUMENTS 3,510,371 A * 5/1970 Frankson ............ 148/DIG. 100
5,989,693 A * 11/1999 Yamasaki et al. ............ 359/580

FOREIGN PATENT DOCUMENTS

| EP | 1084995 | * | 3/2001 |
| WO | 86/07347 | * | 12/1986 |

OTHER PUBLICATIONS

Lee, et al, Effect of Post Plasma Treatment On Reliability of ECRCVD SiOF Films, 1998 International Microprocesses and Nanotechnology Conference, pp. 231–232, Jul. 16, 1998.*

* cited by examiner

*Primary Examiner*—Sean Vincent (57) ABSTRACT

High purity silicon oxyfluoride glass suitable for use as a photomask substrates for photolithography applications in the VUV wavelength region below 190 nm is disclosed. The inventive silicon oxyfluoride glass is transmissive at wavelengths around 157 nm, making it particularly useful as a photomask substrate at the 157 nm wavelength region. The inventive photomask substrate is a "dry," silicon oxyfluoride glass which contains doped $O_2$ molecules and which exhibits very high transmittance and laser transmission durability in the vacuum ultraviolet (VUV) wavelength region. In addition to containing fluorine and having little or no OH content, the inventive silicon oxyfluoride glass suitable for use as a photomask substrate at 157 nm contains intersticial $O_2$ molecules which provide improved endurance to laser exposure. Preferably the $O_2$ doped silicon oxyfluoride glass is characterized by having less than $1 \times 10^{17}$ molecules/cm$^3$ of molecular hydrogen and low chlorine levels.

50 Claims, 7 Drawing Sheets

OXYGEN DOPING OF SILICON OXYFLUORIDE GLASS

CROSS-REFERENCE TO RELATED APPLICATIONS

This application claims priority to U.S. Provisional application Ser. No. 60/271,135, filed Feb. 24, 2001. This application incorporates, by reference, U.S. Ser. No. 09/397,573, filed Sep. 16, 1999, entitled Vacuum Ultraviolet Transmitting Silicon Oxyfluoride Lithography Glass, of Lisa A. Moore and Charlene Smith, now U.S. Pat. No. 6,242,136. The application is related to U.S. application Ser. No. 09/397,572, filed Sep. 16, 1999, entitled Projection Lithography Photomasks And Method Of Making, of George Berkey, Lisa A. Moore and Michelle D. Pierson, now U.S. Pat. No. 6,319,634 and U.S. application Ser. No. 09/397,577, tiled Sep. 16, 1999, entitled Projection Lithography Photomask Blanks, Preforms and Method of Making, of George Berkey, Lisa A. Moore and Charles C. Yu, now U.S. Pat. No. 6,265,115, and U.S. Provisional Ser. No. 60/271,136 filed Feb. 24, 2001, entitled VACUUM ULTRAVIOLET TRANSMITTING SILICON OXYFLUORIDE LITHOGRAPHY GLASS, of Charlene Smith and Lisa Moore, which are hereby incorporated by reference.

FIELD OF THE INVENTION

The present invention relates generally to lithography, and particularly to optical photolithography glass for use in optical photolithography systems utilizing vacuum ultraviolet light (VUV) wavelengths below 193 nm, preferably below 175 nm, preferably below 164 nm, such as VUV projection lithography. systems utilizing wavelengths in the 157 nm region.

The invention relates to VUV transmitting glass that is transmissive at wavelengths below 193 nm, in particular, a photomask silicon oxyfluoride glass suitable for use in the Vacuum Ultraviolet (VUV) 157 nm wavelength region.

BACKGROUND OF THE INVENTION

Refractive optics requires materials having high transmittance. For semiconductor applications where smaller and smaller features are desired at the248 and 193 nm wavelengths, high purity fused silica has been shown to exhibit the required transmittance of 99%/cm or better.

Projection optical photolithography systems that utilize the vacuum ultraviolet wavelengths of light below 193 nm provide benefits in terms of achieving smaller feature dimensions. Such systems that utilize vacuum ultraviolet wavelengths in the 157 nm wavelength region have the potential of improving integrated circuits with smaller feature sizes. Current optical lithography systems used by the semiconductor industry in the manufacture of integrated circuits have progressed towards shorter wavelengths of light, such as the popular 248 nm and 193 nm wavelengths, but the commercial use and adoption of vacuum ultraviolet wavelengths below 193 nm, such as 157 nm has been hindered by the transmission nature of such vacuum ultraviolet wavelengths in the 157 nm region through optical materials. Such slow progression by the semiconductor industry of the use of VUV light below 175 nm such as 157 nm light has been also due to the lack of economically manufacturable photomask blanks from optically transmissive materials. For the benefit of vacuum ultraviolet photolithography in the 157 nm region such as the emission spectrum VUV window of a $F_2$ excimer laser to be utilized in the manufacturing of integrated circuits there is a need for glass that has beneficial optical properties including good transmission below 164 nm and at 157 nm and good durability and that can be manufactured economically.

The present invention overcomes problems in the prior art and provides economical high quality improved photomask blanks and VUV transmitting lithography glass that can used to improve the manufacturing of integrated circuits with vacuum ultraviolet wavelength

SUMMARY OF THE INVENTION

We have shown that dry, high purity fused silica (<1 ppm OH) exhibits superior transmission in the deep ultraviolet compared to "wet" high purity fused silica (e.g., Coming Code 7980). With the addition of fluorine, the transmission of dry silica in the VUV can be even further improved. We have measured transmissions such as 79.8%/6.35 mm (90%/cm internal T) at 157 nm in these glasses. Such materials are of interest for use as components for 157 nm lithography, particularly photomask substrates, pellicles, thin lenses and windows. these applications, it is not only important that the glass exhibits a high initial transmission, but the transmission must not decrease under exposure to the $F_2$ excimer laser. For 157 nm photomask material the glass preferably has <1% transmission loss at 157.6 nm after exposure to the $F_2$ excimer laser for 60 million at 0.1 $mJ/cm^2$-pulse. Our invention describes silicon oxyfluoride glasses containing high levels of molecular oxygen that exhibit lower $F_2$ laser-induced absorption compared to non-oxygen loaded glasses and methods for making them.

The invention includes a method of making a VUV transmitting glass for transmitting below 200 nm VUV wavelengths such as 157 nm wavelengths produced by $F_2$ excimer laser. The method includes providing a silicon oxyfluoride glass, providing a plurality of $O_2$ molecules, and doping the $O_2$ molecules into the silicon oxyfluoride glass to provide a VUV transmitting silicon oxyfluoride glass containing intersticial $O_2$ molecules.

The invention includes a method of making a laser durable VUV transmitting silicon oxyfluoride glass, which is preferably durable to $F_2$ excimer laser exposure with a resistance to $F_2$ laser induced absorption. The method includes providing a consolidated silicon oxyfluoride glass and providing an $O_2$ doping treatment atmosphere. The method includes enveloping the silicon oxyfluoride glass with the $O_2$ doping treatment atmosphere and dissolving a plurality of the $O_2$ molecules from the atmosphere into the silicon oxyfluoride glass to provide a silicon oxyfluoride glass with in solution $O_2$ molecules.

The invention includes a method of making a laser durable VUV transmitting silicon oxyfluoride glass. The method includes providing a non-consolidated silicon oxyfluoride glass precursor and providing a glass consolidation furnace with a heated consolidation zone for consolidating the non-consolidated glass precursor. The method includes supplying an oxygen doping atmosphere to the consolidation furnace and consolidating the glass precursor into a consolidated silicon oxyfluoride glass wherein $O_2$ molecules are dissolved in the consolidated silicon oxyfluoride glass.

The invention includes a VUV transmitting glass photomask substrate. The photomask substrate is comprised of a silicon oxyfluoride glass doped with a plurality of $O_2$ molecules.

The invention includes a VUV transmitting silicon oxyfluoride glass. The VUV transmitting silicon oxyfluoride glass contains a plurality of doped $O_2$ molecules and has a resistance to VUV laser induced absorption bands.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principals and operation of the invention.

BRIEF DESCRIPTION OF DRAWINGS

FIG. 5 shows a VUV transmitting silicon oxyfluoride glass photomask substrate in accordance with the invention (FIG. 5A top view, FIG. 5B side view).

DESCRIPTION OF INVENTION

The invention includes a method of making a VUV transmitting glass. The VUV transmitting glass provides for transmission of below 200 nm VUV wavelengths, such as the 157 nm wavelength emissions of a $F_2$ excimer laser. The VUV transmitting glass is durable to $F_2$ excimer laser exposures and has a resistance to $F_2$ laser induced absorption. The method includes the steps of providing a silicon oxyfluoride glass and providing a plurality of $O_2$ molecules. The method includes doping the $O_2$ molecules into the silicon oxyfluoride glass to provide a VUV transmitting silicon oxyfluoride glass containing intersticial $O_2$ molecules. Providing a silicon oxyfluoride glass preferably includes providing a silicon oxyfluoride glass which contains $\geq 0.1$ wt. % F, more preferably a fluorine content in the range of 0.1 to 2 wt. % F. A preferred fluorine content range is from 0.2 to 1.2 wt. % F. A preferred fluorine content range is from 0.1 to 0.4 wt. % F. A preferred fluorine content is about 1.2 (±0.3) wt. % F. Providing a silicon oxyfluoride glass preferably includes providing a dry silicon oxyfluoride glass which has an OH content below 50 ppm by weight. Preferably the dry silicon oxyfluoride glass has <10 ppm OH by weight, more preferably <5 ppm OH by weight, and most preferably <1 ppm OH by weight. Providing a silicon oxyfluoride glass preferably includes providing a silicon oxyfluoride glass which has a Cl content below 5 ppm by weight, more preferably <1 ppm Cl by weight. Doping the $O_2$ molecules preferably includes dissolving the $O_2$ molecules into the silicon oxyfluoride glass, preferably with the method including causing the $O_2$ molecules to pass into solution in the glass and remain as $O_2$ molecules in the glass when the method of making is completed and the glass is put into use for transmitting light wavelengths. The $O_2$ molecules remain as $O_2$ molecules in the glass at the end of the making process, with the glass containing such intersticial $O_2$ molecules as insolution $O_2$ molecules.

Figure 1:
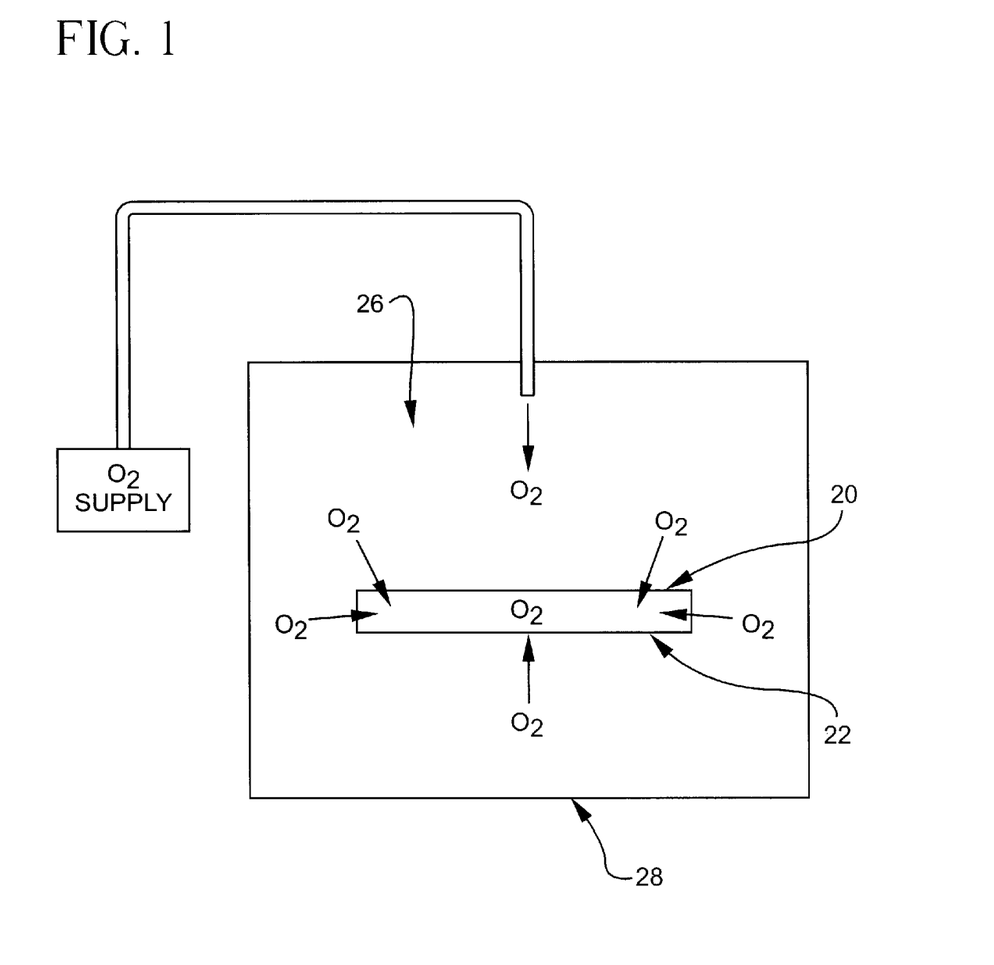
FIG. 1 shows a method and glass in accordance with the invention.
Figure 2:
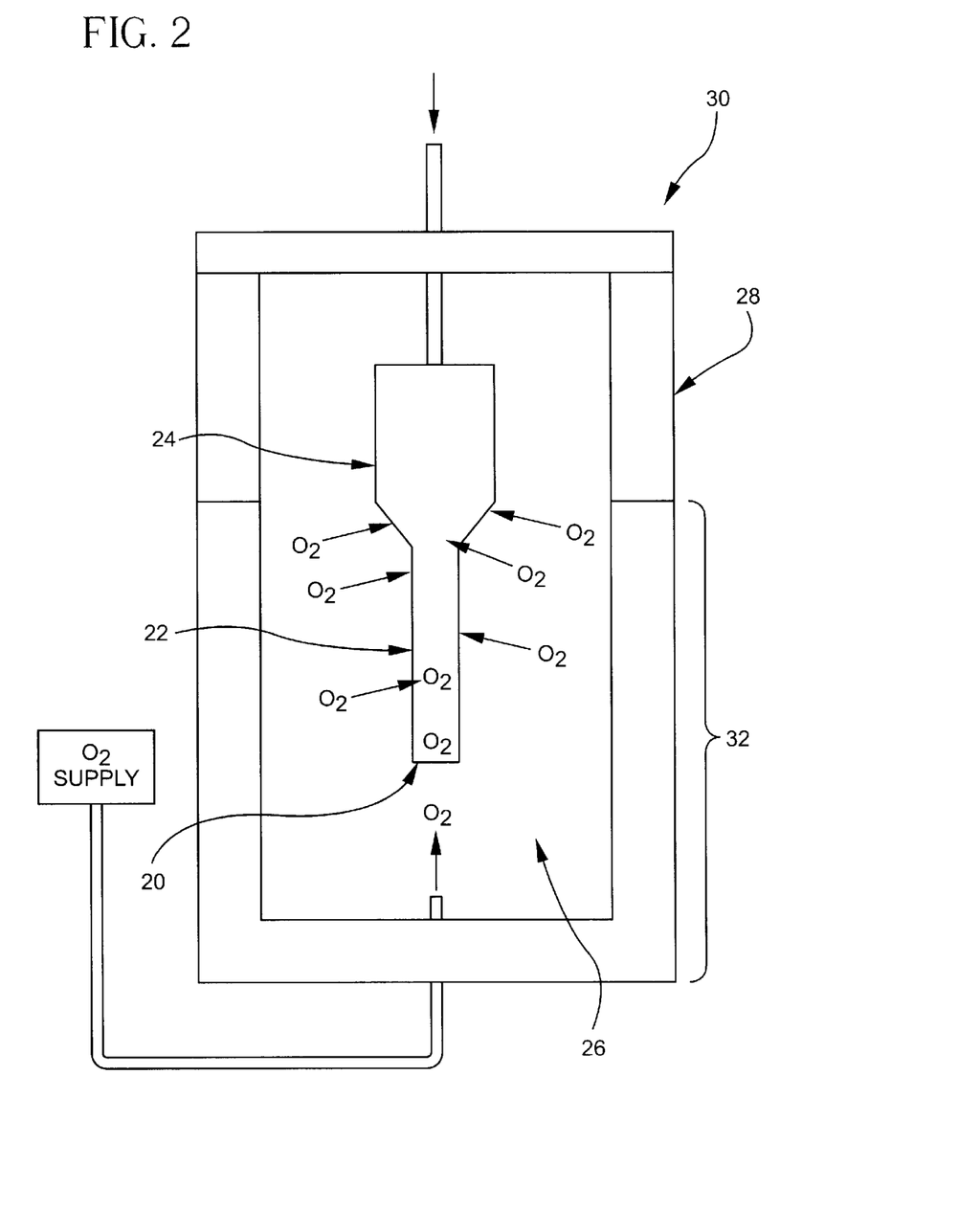
FIG. 2 shows a method and glass in accordance with the invention.

FIG. 1 shows an embodiment of the method of making the VUV transmitting glass 20. The method includes providing an $O_2$ doping treatment atmosphere 26 which has an $O_2$ concentration of at least $10^{15}$ $O_2$ mole/cc. Preferably the $O_2$ doping treatment atmosphere has a concentration of $\geq 10^{16}$ $O_2$ moles/cc. Preferably the $O_2$ doping treatment atmosphere has a concentration of <$10^{20}$ $O_2$ moles/cc. A particularly preferred range of $O_2$ concentration is in the range of about $10^{16}$ to $10^{20}$ $O_2$ moles/cc. The method preferably includes providing an $O_2$ doping vessel 28 for containing the $O_2$ doping treatment atmosphere and silicon oxyfluoride glass 22. The method preferably includes heating treatment atmosphere 26 and glass 22 to a predetermined $O_2$ doping temperature which is effective for doping the molecules of $O_2$ into the glass. Preferably, the $O_2$ doping temperature is at least 600° C. Preferably the $O_2$ doping treatment atmosphere is at least one atmosphere of $O_2$. In an embodiment the invention includes hipping the glass 22 so that the glass is hot isostatically pressed in the presence of that $O_2$ molecules. In an embodiment the invention includes pressurizing the interior of the $O_2$ doping vessel so that the glass 22 is doped with $O_2$ from a pressurized $O_2$ treatment atmosphere. Preferably the $O_2$ doping treatment vessel 28 is comprised of a non-contaminant refractory material. More preferably the non-contaminating refractory material treatment vessel is non-metallic such as a silica quartz muffle furnace or a non-metallic bell jar. As shown in FIG. 2, in an embodiment the method includes consolidating the silicon oxyfluoride glass in the presence of, and with, the $O_2$ molecules. In FIG. 2, the non-consolidated glass 24 is consolidated into consolidated glass 22 in the presence of the $O_2$ molecules so that the resulting consolidated silicon oxyfluoride glass 20 contains doped $O_2$ molecules.

The invention includes a method of making a laser durable VUV transmitting silicon oxyfluoride glass. The method includes providing a consolidated silicon oxyfluoride glass 22. The method includes providing a $O_2$ doping treatment atmosphere. The method includes enveloping the silicon oxyfluoride glass with the $O_2$ doping treatment atmosphere and dissolving a plurality of the $O_2$ molecules from the atmosphere into the silicon oxyfluoride glass to provide a silicon oxyfluoride glass with insolution $O_2$ molecules. As shown in FIG. 1, vessel 28 contains consolidated glass 22 and $O_2$ molecule atmosphere 26 provided by the $O_2$ supply source so that the glass is enveloped in the $O_2$ doping treatment atmosphere. Preferably the method includes heating the $O_2$ doping treatment atmosphere and the silicon oxyfluoride glass to a predetermined $O_2$ doping temperature, preferably at >600° C. A preferred $O_2$ doping temperature is about 1000 (±100) degrees C., most preferably with about one atmosphere of oxygen. Providing an $O_2$ doping treatment atmosphere 26 preferably include providing an atmosphere with an $O_2$ concentration of at least $10^{15}$ $O_2$ moles/cc, more preferably at least $10^{16}$ $O_2$ moles/cc. Preferably the atmosphere $O_2$ concentration is no greater than $10^{20}$ $O_2$ moles/cc. A preferred $O_2$ concentration doping treatment atmosphere range is about $10^{16}$–$10^{18}$ $O_2$ moles/cc.

The invention includes a method of making a laser durable VUV transmitting silicon oxyfluoride glass. An embodiment of the invention is shown in FIG. 2. The method includes providing a non-consolidated silicon oxyfluoride glass precursor 24. The method includes providing a glass consolidation furnace 30 with a heated consolidation zone 32 for consolidating the non-consolidated glass precursor. The method includes supplying an oxygen doping atmosphere 26 to the consolidating furnace 30 and consolidating the glass precursor into a consolidated silicon oxyfluoride glass wherein $O_2$ molecules are dissolved in the consolidated silicon oxyfluoride glass. Preferably the method includes heating the oxygen doping atmosphere and the consolidating glass 24 to a predetermined $O_2$ doping consolidation temperature. In an embodiment, providing a glass consolidation furnace 30 includes providing a non-contaminant refractory material non-metallic silica muffle furnace. In an embodiment providing a glass consolidation furnace 30 includes providing a plasma discharge glass consolidation furnace. In a embodiment the plasma discharge of the plasma discharge glass consolidating furnace is utilized to heat and consolidate the non-consolidate precursor into the consolidated glass in the presence of the $O_2$. For example, non-consolidated glass particles other Si containing feedstocks are fed into a plasma discharge along with oxygen in a direct laydown plasma process. Supplying an oxygen doping atmosphere preferably includes supplying an atmosphere with an $O_2$ concentration of at least $10^{15}$ $O_2$ moles/cc, more preferably $\geq 10^{16}$ $O_2$ moles/cc. Preferably the oxygen doping atmosphere has an $O_2$ concentration no greater than $10^{20}$ $O_2$ moles/cc. Preferably the doping atmosphere has an $O_2$ concentration in the range of $10^{16}$ to $10^{18}$ moles/cc. Preferably when the non-consolidated glass is a soot body preform, the glass is consolidated under a highly oxidizing atmosphere which is at least 50% by volume $O_2$. The $O_2$ doped glass is thus consolidated and synthesize so as to contain $O_2$ molecules.

Figure 3:
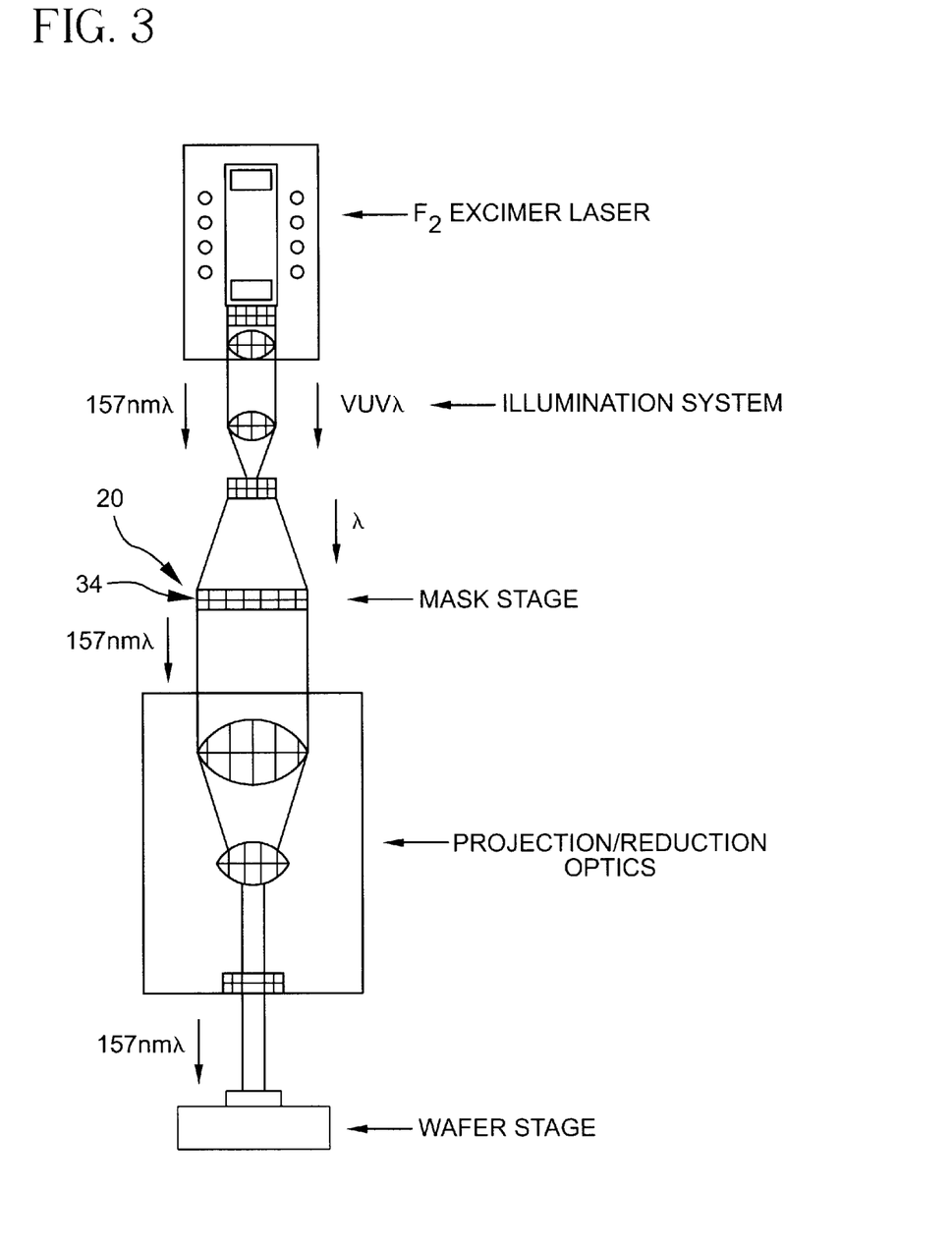
FIG. 3 shows a method, a VUV lithography system, and glass in accordance with the invention.
Figure 4:
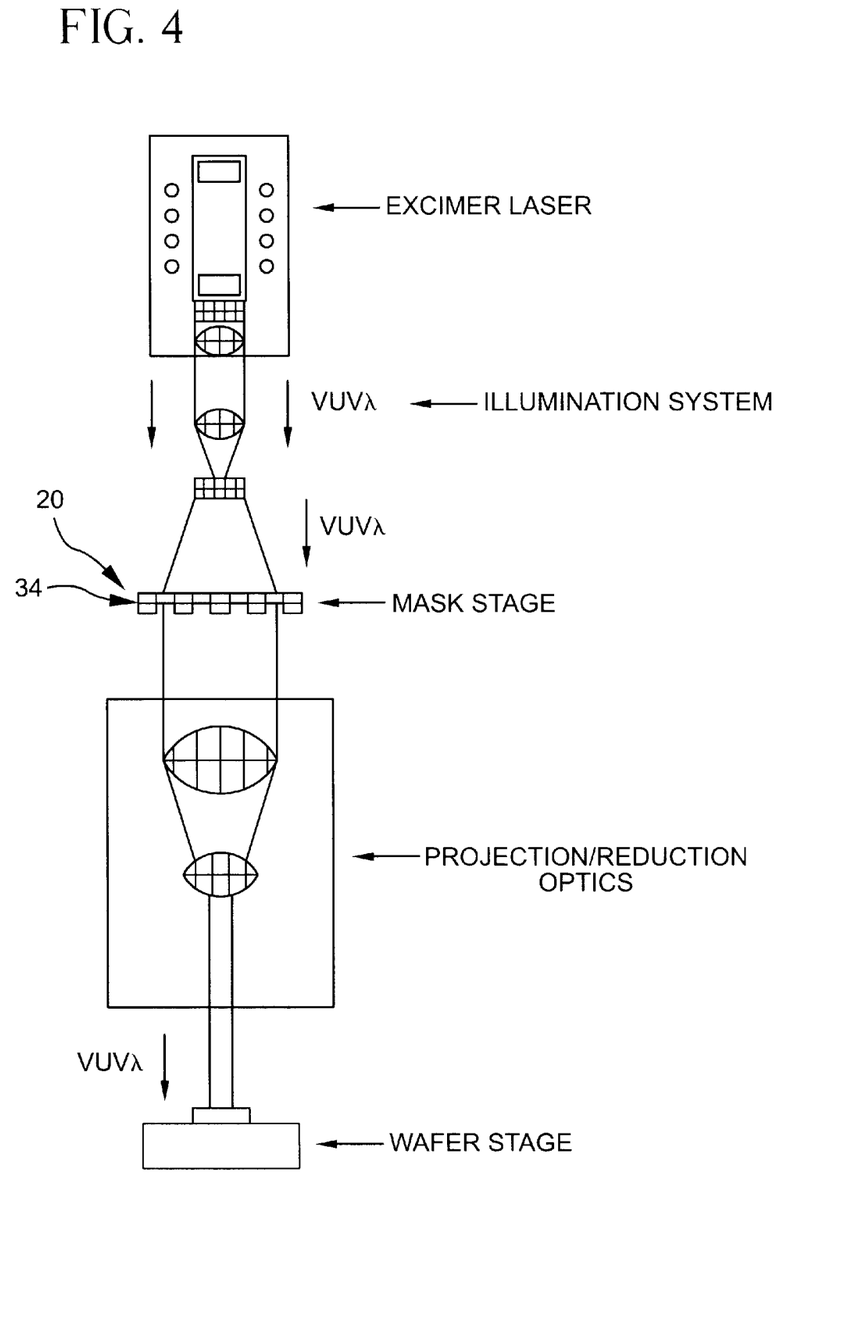
FIG. 4 shows a method, a VUV lithography system, and glass in accordance with the invention.
Figure 5A:
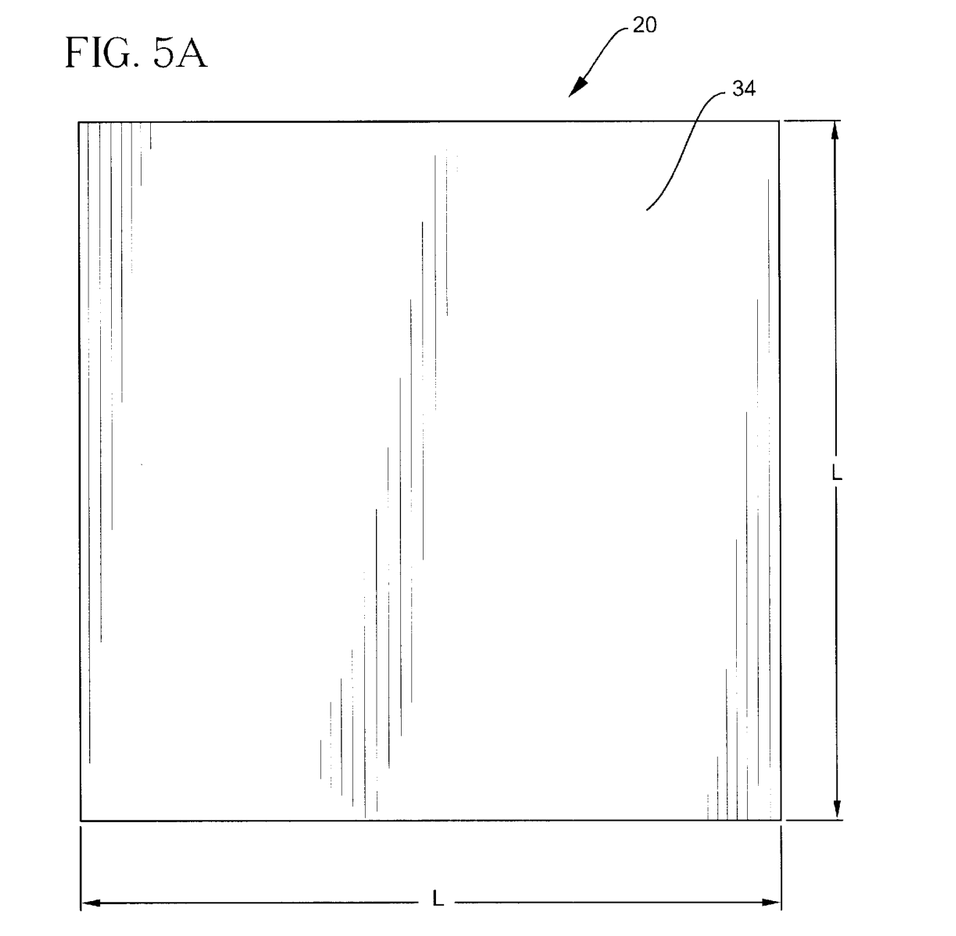
Figure 5B:
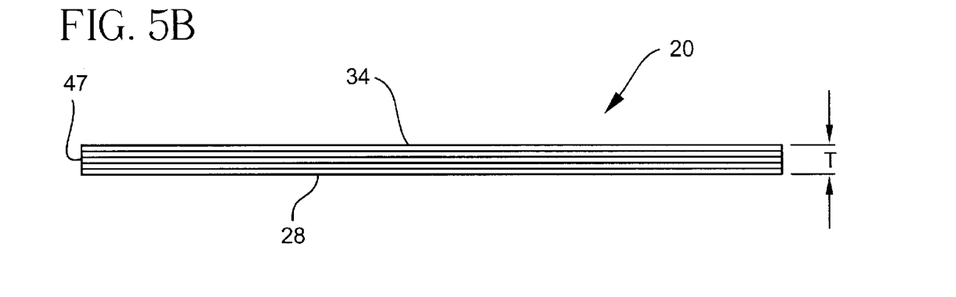

The invention includes a VUV transmitting glass photomask substrate. FIGS. 3–5 show a VUV transmitting glass photomask substrate 34. The VUV transmitting glass photomask substrate 34 is comprised of a silicon oxyfluoride glass doped with a plurality of $O_2$ molecule s. Preferably the silicon oxyfluoride glass contains at least 0.1 weight percent fluorine, more preferably a fluorine content in the range of 0.1 to 2 wt. % F. A preferred fluorine content range is from 0.2 to 1.2 wt. % F. A preferred fluorine content range is from 0.1 to 0.4 wt. % F. A preferred fluorine content is about 1.2 (±0.3) wt. % F. Preferably the silicon oxyfluoride glass doped with $O_2$ is a dry glass, preferably with an OH content below 50 ppm by weight. Preferably the $O_2$ doped low OH silicon oxyfluoride glass photomask substrate blank 34 has an OH content <10 ppm by wt., more preferred <5 ppm by wt., and most preferred <1 ppm by wt. Preferably the dry silicon oxyfluoride glass doped with $O_2$ has a Cl content below 5 ppm by weight, and more preferred <1 ppm Cl by weight. Preferably the photomask substrate glass has a 165 nm absorption less than 0.2 absorption units/5.1 mm. Preferably the photomask substrate glass has a 215 nm absorption less than 0.2 absorption units/5.1 mm. Preferably the silicon oxyfluoride glass has a resistance to $F_2$ excimer 157 nm laser induced 165 nm absorption bands. Preferably the silicon oxyfluoride glass has a 165 nm absorption less than 0.3 absorption units/5.1 mm after an $F_2$ excimer laser exposure of at least 9.92 E6 pulses at 2 mJ/cm$^2$-pulse. Preferably the silicon oxyfluoride glass has a 215 nm absorption less than 0.2 absorption units/5.1 mm after an $F_2$ excimer laser exposure of at least 9.92 E6 pulses at 2 mJ/cm$^2$-pulse. Preferably the silicon oxyfluoride glass has a laser induced absorption at 157 nm less than 0.4 absorption units/5 mm after an $F_2$ excimer laser exposure of at least 9.92 E6 pulses at 2 mJ/cm$^2$-pulse. Preferably, the silicon oxyfluoride glass substrate has a 157 nm laser induced delta absorption <0.20 absorption units/5 mm after an $F_2$ excimer laser exposure of at least 9.92 E6 pulses at 2 mJ/cm$^2$-pulse.

The invention includes a VUV transmitting silicon oxyfluoride lithography glass for transmitting wavelengths below 200 nm. The VUV transmitting silicon oxyfluoride glass of the invention is shown by the cross hatching in FIGS. 3–4. The inventive VUV transmitting silicon oxyfluoride glass contains a plurality of doped $O_2$ molecules and has a resistance to VUV laser induced absorption bands. The VUV transmitting glass is comprised of a silicon oxyfluoride glass doped with a plurality of intersticial $O_2$ molecules. Preferably the silicon oxyfluoride glass contains at least 0.1 weight percent fluorine, more preferably a fluorine content in the range of 0.1 to 2 wt. % F. A preferred fluorine content range is from 0.2 to 1.2 wt. % F. A preferred fluorine content range is from 0.1 to 0.4 wt. % F. A preferred fluorine content is about 1.2 (±0.3) wt. % F. Preferably the silicon oxyfluoride glass doped with $O_2$ is a dry glass, preferably with an OH content below 50 ppm by weight. Preferably the $O_2$ doped low OH silicon oxyfluoride glass has an OH content <10 ppm by wt., more preferred <5 ppm by wt., and most preferred <1 ppm by wt. Preferably the dry silicon oxyfluoride glass doped with $O_2$ has a Cl content below 5 ppm by weight, and more preferred <1 ppm Cl by weight. Preferably the glass has a 165 nm absorption less than 0.2 absorption units/5.1 mm. Preferably the glass has a 215 nm absorption less than 0.2 absorption units/5.1 mm. Preferably the silicon oxyfluoride glass has a resistance to $F_2$ excimer 157 nm laser induced 165 nm absorption bands. Preferably the silicon oxyfluoride glass has a 165 nm absorption less than 0.3 absorption units/5.1 mm after an $F_2$ excimer laser exposure of at least 9.92 E6 pulses at 2 mJ/cm$^2$-pulse. Preferably the silicon oxyfluoride glass has a 215 nm absorption less than 0.2 absorption units/5.1 mm after an $F_2$ excimer laser exposure of at least 9.92 E6 pulses at 2 mJ/cm -pulse. Preferably the silicon oxyfluoride glass has a laser induced absorption at 157 nm less than 0.4 absorption units/5 mm after an $F_2$ excimer laser exposure of at least 9.92 E6 pulses at 2 mJ/cm$^2$-pulse. Preferably, the silicon oxyfluoride glass has a 157 nm laser induced delta absorption <0.20 absorption units/5 mm after an $F_2$ excimer laser exposure of at least 9.92 E6 pulses at 2 mJ/cm$^2$-pulse.

Figure 6:
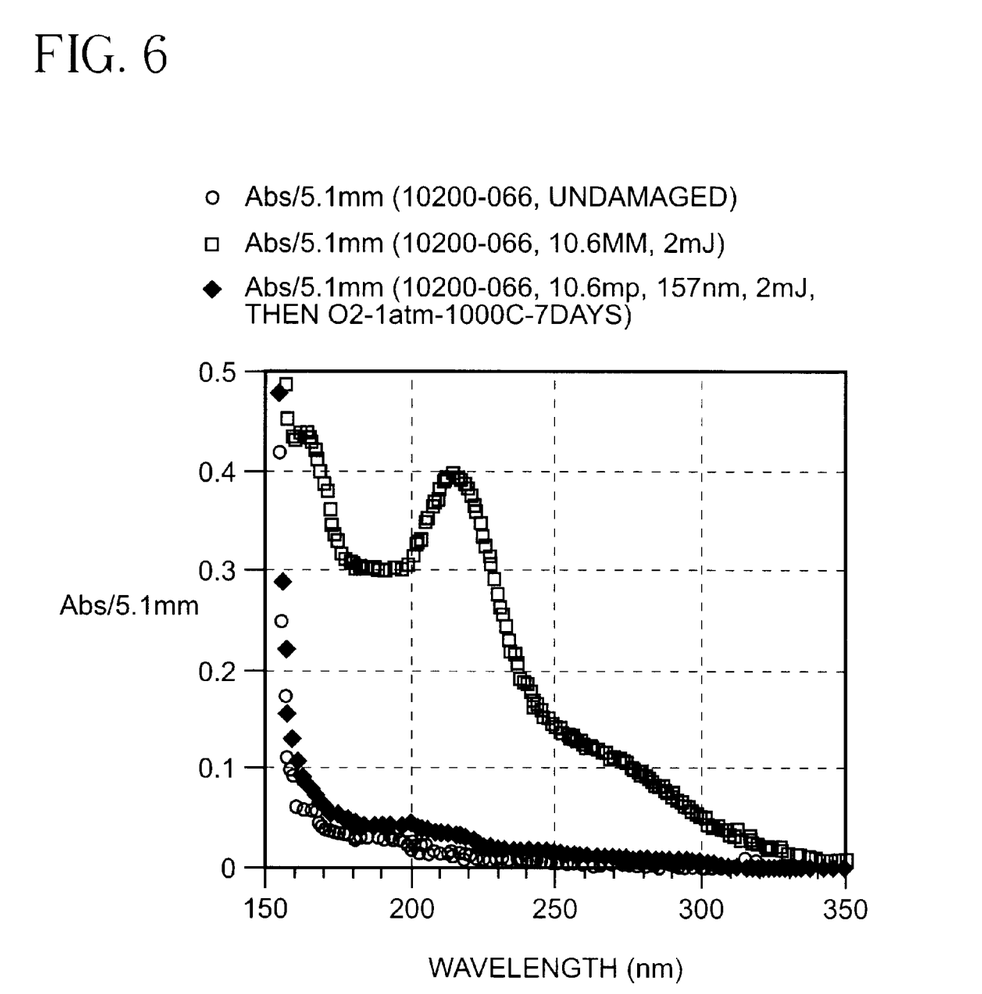
FIG. 6 shows a VUV absorption spectra of a silicon oxyfluoride glass before exposure to a $F_2$ excimer laser (open circles), after exposing to the $F_2$ excimer laser for 10.6E6 pulses at 2 mJ/cm$^2$-pulse (open squares), and after $F_2$ excimer laser exposure and oxygen treatment (1 atmosphere $O_2$ for 7 days at 1000 degrees C)(closed diamonds).

We have discovered that the induced absorption in a dry, silicon oxyfluoride glasses that has been exposed to the $F_2$ excimer laser can be largely removed by heat treating the glass, in an oxygen atmosphere. FIG. 6 shows the VUV spectra of a dry (<1 ppm OH), silicon oxyfluoride-doped (1.2 wt. % F) glass as made (open circles, lowest curve) and then after being exposed to 10.6E6 pulses at 2 mJ/cm$^2$-pulse at 157 nm (open squares, highest curve). The appearance of the E' center at 215 nm as well as the more important 165 nm band (ODC) is clear. This glass was then held under oxygen (1 atm) at 1000° C. for 7 days. The 165 nm band as well as the 215 nm band disappear under these conditions (closed diamonds, middle curve).

Figure 7:
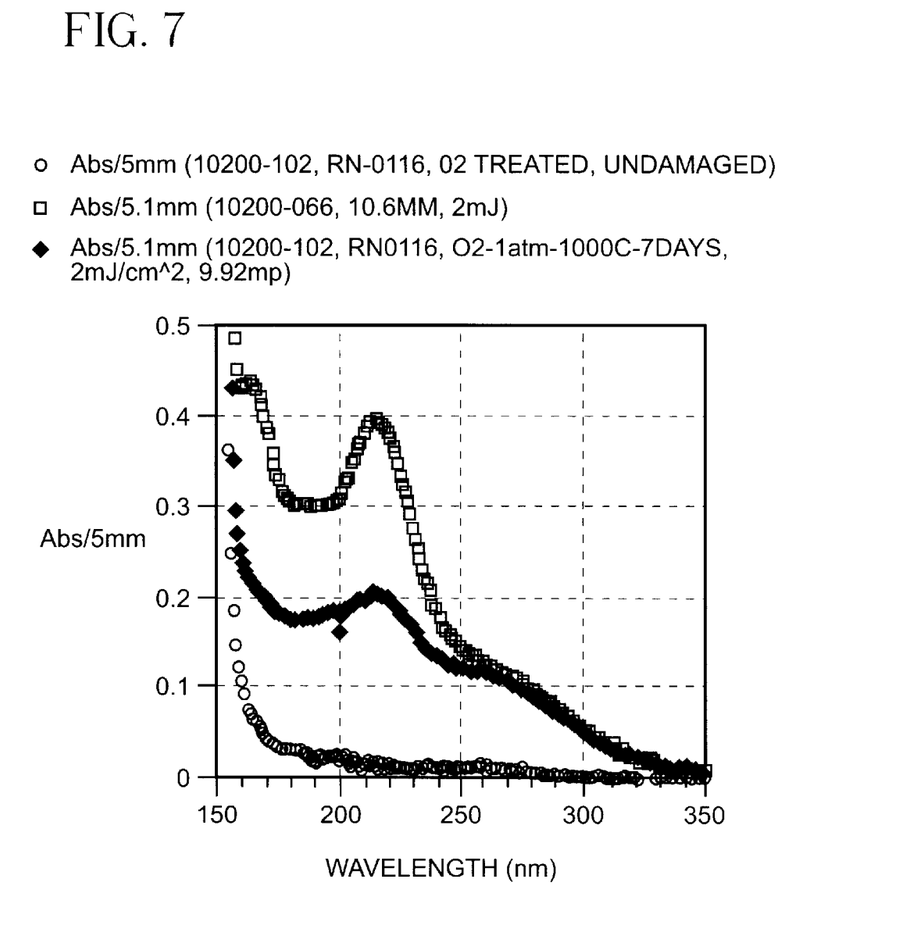
FIG. 7 shows a VUV absorption spectra of silicon oxyfluoride glass that was heat treated in oxygen (open circles), then exposed to the F2 excimer laser for 9.92E6 pulses at 2 mJ/cm$^2$-pulse (closed diamonds). A VUV absorption spectra curve for the same glass without an oxygen pretreatment exposed to the same laser conditions (10.6E6 pulses at 2 mJ/cm$^2$-pulse, open squares) is included for comparison.

We have discovered that dry, silicon oxyfluoride silica glasses containing high levels of molecular oxygen show significantly lower induced absorption when exposed to the $F_2$ excimer laser than silicon oxyfluoride silica glasses that do not contain excess oxygen. FIG. 7 shows the VUV spectra of the same silicon oxyfluoride glass as in FIG. 6 that was pre-treated in oxygen (open circles, lowest curve), then exposed to the $F_2$ excimer laser for 9.92E6 pulses at 2 mJ/cm$^2$-pulse (closed diamonds, middle curve). The open circles lowest curve spectrum is the glass after $O_2$-loading, before exposure. The closed diamonds middle curve spectrum is the $O_2$-loaded glass exposed at 157 nm for about 10E6 pulses, and the open squares highest curve spectrum is the same as in FIG. 6, of the glass as made, exposed to 10.6E6 pulses (for comparison). The feature to notice in the comparison is the lack of a 165 nm band (ODC) in the $O_2$-containing glass. The presence of oxygen inhibits the formation of the 165 nm band. Since the 165 nm band is close to 157 nm, reducing this absorption band significantly reduces the induced absorption at 157 nm. The table below summarizes these results:

| Sample | Abs/5 mm (T/5 mm) | Delta Abs (Delta T/5 mm) |
|---|---|---|
| As-made | 0.18 (66) | — |
| $O_2$-treated | 0.18 (66) | — |
| As-made, exposed | 0.49 (32) | 0.31 (−34) |
| $O_2$-treated, exposed | 0.35 (45) | 0.17 (−21) |

Silicon oxyfluoride glasses containing excess oxygen can be made by several methods First, as described above, the as-made silicon oxyfluoride glasses glass can be exposed to an oxygen atmosphere at elevated temperatures to diffuse $O_2$ into the structure. Second, the glass can be synthesized so as to contain excess oxygen. Silica glasses made by direct laydown processes(e.g., plasma) have been made with high excess oxygen levels compared to glasses made by soot preform body-to-consolidated glass body processes. Finally, the oxygen content of silicon oxyfluoride glasses made by soot preform body -to- consolidated glass body processing can be increased by consolidating under a highly oxidizing atmosphere (e.g. 50–100% $O_2$).

The invention provides silicon oxyfluoride glasses with improved resistance to $F_2$ laser induced absorption and methods for making them. These inventive silicon oxyfluoride glasses materials are useful for 157 nm lithography applications such as photomasks, lenses, pellicles, and windows, for example.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A VUV transmitting silicon oxyfluoride glass, said silicon oxyfluoride glass containing a plurality of doped $O_2$ molecules and having a resistance to VUV laser induced absorption bands.

2. A VUV transmitting silicon oxyfluoride glass as claimed in claim 1, said silicon oxyfluoride glass, containing at least 0.1 weight percent fluorine.

3. A VUV transmitting silicon oxyfluoride glass as claimed in claim 1, said silicon oxyfluoride glass having an OH content below 50 ppm by weight.

4. A VUV transmitting silicon oxyfluoride glass as claimed in claim 1, said silicon oxyfluoride glass having an OH content below 10 ppm by weight.

5. A VUV transmitting silicon oxyfluoride glass as claimed in claim 1, said silicon oxyfluoride glass having an OH content below 5 ppm by weight.

6. A VUV transmitting silicon oxyfluoride glass as claimed in claim 1, said silicon oxyfluoride glass having an OH content below 1 ppm by weight.

7. A VUV transmitting silicon oxyfluoride glass as claimed in claim 1, said silicon oxyfluoride glass having an Cl content below 5 ppm by weight.

8. A VUV transmitting silicon oxyfluoride glass as claimed in claim 1, said silicon oxyfluoride glass having a 165 nm absorption less than 0.2 absorption units/5.1 mm.

9. A VUV transmitting silicon oxyfluoride glass as claimed in claim 1, said silicon oxyfluoride glass having a 215 nm absorption less than 0.2 absorption units/5.1 mm.

10. A VUV transmitting silicon oxyfluoride glass as claimed in claim 1, said silicon oxyfluoride glass having a resistance to laser induced 165 nm absorption band.

11. A VUV transmitting silicon oxyfluoride glass as claimed in claim 1, said silicon oxyfluoride glass having a 165 nm absorption less than 0.3 absorption units/5.1 mm after an $F_2$ excimer laser exposure of at least 9.92 E6 pulses at 2 mJ/$cm^2$-pulse.

12. A VUV transmitting silicon oxyfluoride glass as claimed in claim 1, said silicon oxyfluoride glass having a 215 nm absorption less than 0.2 absorption units/5.1 mm after an $F_2$ excimer laser exposure of at least 9.92 E6 pulses at 2 mJ/$cm^2$-pulse.

13. A VUV transmitting silicon oxyfluoride glass as claimed in claim 1, said silicon oxyfluoride glass having a laser induced absorption at 157 nm less than 0.4 absorption units/5 mm after an $F_2$ excimer laser exposure of at least 9.92 E6 pulses at 2 mJ/$cm^2$-pulse.

14. A VUV transmitting silicon oxyfluoride glass as claimed in claim 1, said silicon oxyfluoride glass having a 157 nm laser induced delta absorption <0.20 absorption units/5 mm after an F2 excimer laser exposure of at least 9.92 E6 pulses at 2 mJ/$cm^2$-pulse.

15. A VUV transmitting glass photomask substrate, said photomask substrate comprising a silicon oxyfluoride glass, said silicon oxyfluoride glass doped with a plurality of $O_2$ molecules.

16. A photomask substrate as claimed in claim 15, said silicon oxyfluoride glass, containing at least 0.1 weight percent fluorine.

17. A photomask substrate as claimed in claim 15, said silicon oxyfluoride glass having an OH content below 50 ppm by weight.

18. A photomask substrate as claimed in claim 15, said silicon oxyfluoride glass having an OH content below 10 ppm by weight.

19. A photomask substrate as claimed in claim 15, said silicon oxyfluoride glass having an OH content below 5 ppm by weight.

20. A photomask substrate as claimed in claim 15, said silicon oxyfluoride glass having an OH content below 1 ppm by weight.

21. A photomask substrate as claimed in claim 15, said silicon oxyfluoride glass having an Cl content below 5 ppm by weight.

22. A photomask substrate as claimed in claim 15, said silicon oxyfluoride glass having a 165 nm absorption less than 0.2 absorption units/5.1 mm.

23. A photomask substrate as claimed in claim 15, said silicon oxyfluoride glass having a 215 nm absorption less than 0.2 absorption units/5.1 mm.

24. A photomask substrate as claimed in claim 15, said silicon oxyfluoride glass having a resistance to laser induced 165 nm absorption band.

25. A photomask substrate as claimed in claim 15, said silicon oxyfluoride glass having a 165 nm absorption less than 0.3 absorption units/5.1 mm after an $F_2$ excimer laser exposure of at least 9.92 E6 pulses at 2 mJ/$cm^2$-pulse.

26. A photomask substrate as claimed in claim 15, said silicon oxyfluoride glass having a 215 nm absorption less than 0.2 absorption units/5.1 mm after an $F_2$ excimer laser exposure of at least 9.92 E6 pulses at 2 $mJ/cm^2$-pulse.

27. A photomask substrate as claimed in claim 15, said silicon oxyfluoride glass having a laser induced absorption at 157 nm less than 0.4 absorption units/5 mm after an $F_2$ excimer laser exposure of at least 9.92 E6 pulses at 2 $mJ/cm^2$-pulse.

28. A photomask substrate as claimed in claim 15, said silicon oxyfluoride glass substrate having a 157 nm laser induced delta absorption <0.20 absorption units/5 mm after an F2 excimer laser exposure of at least 9.92 E6 pulses at 2 $mJ/cm^2$-pulse.

29. A method of making a VUV transmitting glass, said method comprising providing a silicon oxyfluoride glass, providing a plurality of $O_2$ molecules, doping said $O_2$ molecules into said silicon oxyfluoride glass to provide a VUV transmitting silicon oxyfluoride glass containing $O_2$ molecules.

30. A method as claimed in claim 29, said method including dissolving said $O_2$ molecules into said silicon oxyfluoride glass.

31. A method as claimed in claim 29, said method including consolidating said silicon oxyfluoride glass with said $O_2$ molecules.

32. A method as claimed in claim 29, said method including providing a silicon oxyfluoride glass which contains at least 0.1 weight percent fluorine.

33. A method as claimed in claim 29, said method including silicon oxyfluoride glass which has an OH content below 50 ppm by weight.

34. A method as claimed in claim 29, said method including providing a silicon oxyfluoride glass which has a Cl content below 5 ppm by weight.

35. A method as claimed in claim 29, said method including providing an $O_2$ doping treatment atmosphere, said $O_2$ doping treatment atmosphere having an $O_2$ concentration of at least $10^{15}$ $O_2$ mole/cc.

36. A method as claimed in claim 35, said method including providing an $O_2$ doping vessel for containing said $O_2$ doping treatment atmosphere and said silicon oxyfluoride glass.

37. A method as claimed in claim 36, said method including heating said treatment atmosphere and glass to an $O_2$ doping temperature.

38. A method as claimed in claim 37, wherein said $O_2$ doping treatment vessel is comprised of a non-contaminant refractory material.

39. A method of making a laser durable VUV transmitting silicon oxyfluoride glass, said method comprising the steps of:

providing a consolidated silicon oxyfluoride glass, providing an $O_2$ doping treatment atmosphere, enveloping said silicon oxyfluoride glass with said $O_2$ doping treatment atmosphere and dissolving a plurality of $O_2$ molecules from said atmosphere into said silicon oxyfluoride glass to provide a silicon oxyfluoride glass with insolution $O_2$ molecules.

40. A method as claimed in claim 39, said method including heating said atmosphere and said silicon oxyfluoride glass to a pre-determined $O_2$ doping temperature.

41. A method as claimed in claim 39, wherein providing an $O_2$ doping treatment atmosphere includes providing an atmosphere with an $O_2$ concentration of at least $10^{15}$ $O_2$ moles/cc.

42. A method as claimed in claim 39, wherein providing an $O_2$ doping treatment atmosphere includes providing an atmosphere with an $O_2$ concentration of at least $10^{16}$ $O_2$ moles/cc.

43. A method as claimed in claim 41, wherein said atmosphere $O_2$ concentration is no greater than $10^{20}$ $O_2$ moles/cc.

44. A method of making a laser durable VUV transmitting silicon oxyfluoride glass, said method comprising the steps of;

providing a non-consolidated silicon oxyfluoride glass precursor, providing a glass consolidation furnace with a heated consolidation zone for consolidating said non-consolidated glass precursor;

supplying an oxygen doping atmosphere to said consolidation furnace and consolidating said glass precursor into a consolidated silicon oxyfluoride glass wherein $O_2$ molecules are dissolved in said consolidated silicon oxyfluoride glass.

45. A method as claimed in claim 44, said method including heating said oxygen doping atmosphere to a predetermined $O_2$ doping consolidation temperature.

46. A method as claimed in claim 44, wherein supplying an oxygen doping atmosphere includes supplying an atmosphere with an $O_2$ concentration of at least $10^{15}$ $O_2$ moles/cc.

47. A method as claimed in claim 44, wherein supplying an oxygen doping atmosphere includes supplying an atmosphere with an $O_2$ concentration of at least $10^{16}$ $O_2$ moles/cc.

48. A method as claimed in claim 46, wherein said $O_2$ concentration is no greater than $10^{20}$ $O_2$ moles/cc.

49. A method as claimed in claim 44, wherein providing a glass consolidation furnace includes providing a silica muffle furnace.

50. A method as claimed in claim 44, wherein providing a glass consolidation furnace includes providing a plasma discharge.

* * * * *